(12) United States Patent
Monadgemi

(10) Patent No.: US 8,790,996 B2
(45) Date of Patent: Jul. 29, 2014

(54) METHOD OF PROCESSING A DEVICE SUBSTRATE

(75) Inventor: Pezhman Monadgemi, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 57 days.

(21) Appl. No.: 13/550,052

(22) Filed: Jul. 16, 2012

(65) Prior Publication Data

US 2014/0017878 A1 Jan. 16, 2014

(51) Int. Cl.
*H01L 21/78* (2006.01)
(52) U.S. Cl.
USPC .......... 438/462; 257/686; 257/E21.122; 257/E21.238; 257/E21.6; 438/459; 438/464
(58) Field of Classification Search
USPC .......... 257/122, 686, E21.238, E21.599; 438/459, 462, 464
See application file for complete search history.

(56) References Cited

U.S. PATENT DOCUMENTS

| 4,729,971 | A | 3/1988 | Coleman |
| 6,717,254 | B2 * | 4/2004 | Siniaguine ............ 257/690 |
| 8,021,964 | B2 * | 9/2011 | Akiyama et al. ............ 438/460 |
| 8,470,641 | B2 * | 6/2013 | Takahashi ............ 438/112 |
| 8,503,186 | B2 * | 8/2013 | Lin et al. ............ 361/760 |

| 2006/0138629 | A1 | 6/2006 | Fukazawa |
| 2007/0218649 | A1 | 9/2007 | Hernandez |
| 2011/0031631 | A1 * | 2/2011 | Masuko et al. ............ 257/774 |
| 2011/0048611 | A1 | 3/2011 | Carre et al. |

FOREIGN PATENT DOCUMENTS

| EP | 1804287 A2 | 7/2007 |
| WO | 2008002790 A1 | 1/2008 |

OTHER PUBLICATIONS

Partial International Search Report for Application No. PCT/US2013/050469 dated Sep. 10, 2013.
International Search Report and Written Opinion for Application No. PCT/US2013/050469 dated Nov. 18, 2013.

* cited by examiner

*Primary Examiner* — John C Ingham
(74) *Attorney, Agent, or Firm* — Lerner, David, Littenberg, Krumholz & Mentlik, LLP

(57) ABSTRACT

Methods of processing a device substrate are disclosed herein. In one embodiment, a method of processing a device substrate can include bonding a first surface of a device substrate to a carrier with a polymeric material. The device substrate may have a plurality of first openings extending from the first surface towards a second surface of the device substrate opposite from the first surface. Then, material can be removed at the second surface of the device substrate, wherein at least some of the first openings communicate with the second surface at least one of before or after performing the removal of the material. Then, at least a portion of the polymeric material disposed between the first surface and the carrier substrate can be exposed to a substance through at least some first openings to debond the device substrate from the carrier substrate.

47 Claims, 10 Drawing Sheets

METHOD OF PROCESSING A DEVICE SUBSTRATE

FIELD OF THE INVENTION

The present application relates to methods of processing a device substrate, e.g., a semiconductor wafer, by bonding the device substrate to a carrier substrate, and debonding the device substrate therefrom after removing material from the device substrate.

BACKGROUND OF THE INVENTION

Substrate processing can require a substrate to be temporarily coupled to a carrier substrate. For example, such temporary coupling may be necessary to support the substrate during processing, such as when material is removed from the substrate by mechanical means such as grinding, for example.

Unfortunately, conventional bonding and de-bonding methods have several limitations. For example, some conventional methods can require specialized bonding material and debonding tools that are available only from limited sources. In some cases, the conditions, e.g., heat or pressure that must be applied to debond are not easily integrated with other processing applied to the substrate and may cause cracks or induce stress in the device substrate. In some cases, specialized carrier substrates are required.

Unfortunately, these conventional methods may add to the cost of substrate processing due to need for specialized bonding materials, carrier substrates, and/or expensive de-bonding equipment, and low throughput that may result from these specialized materials and/or equipment.

Thus, improved methods of processing a device substrate are provided herein.

BRIEF SUMMARY OF THE INVENTION

Methods of processing a device substrate are disclosed herein. In one embodiment, a method of processing a device substrate can include bonding a first surface of a device substrate to a carrier with a polymeric material. The device substrate may have a plurality of first openings extending from the first surface towards a second surface of the device substrate opposite from the first surface. Then, material can be removed at the second surface of the device substrate, wherein at least some of the first openings communicate with the second surface at least one of before or after performing the removal of the material. Then, at least a portion of the polymeric material disposed between the first surface and the carrier substrate can be exposed to a substance through at least some first openings to debond the device substrate from the carrier substrate.

In one embodiment, when bonding of the first surface of the device substrate to the carrier substrate is performed, the polymeric material may be disposed atop the first surface and extends from the first surface into at least some of the first openings.

In one embodiment, the device substrate may have a plurality of microelectronic elements, wherein each microelectronic element may have a plurality of active circuit elements thereon.

In one embodiment, the device substrate may be a semiconductor wafer and the microelectronic elements may be semiconductor chips which are integral portions of the wafer and are bounded at edges of each semiconductor chip at dicing lanes of the wafer, and wherein the microelectronic elements may be configured to be separated from one another by severing the wafer along the dicing lanes.

In one embodiment, at least portions of at least some of the first openings may be disposed within the dicing lanes.

In one embodiment, each of the plurality of first openings may be fully disposed within the dicing lanes.

In one embodiment, at least some of the first openings may extend to areas of the semiconductor chips outside the dicing lanes.

In one embodiment, at least some of the first openings may be completely disposed outside of the dicing lanes.

In one embodiment, when bonding of the first surface of the device substrate to the carrier substrate is performed, the device substrate may have a plurality of electrically conductive columns extending within a plurality of second openings extending in a direction of a thickness of the device substrate.

In one embodiment, material can be removed at the second surface of the device substrate so as to cause at least some of the conductive columns to become exposed at the second surface of the device substrate.

In one embodiment, material removal at the second surface of the device substrate may include reducing a thickness of the device substrate by at least one of grinding, lapping or polishing applied to the second surface.

In one embodiment, reducing the thickness of the device substrate may be performed such that each first and second opening may be within a predetermined distance from the second surface; and then etching the device substrate from the second surface may be performed to cause the at least some first openings to be in communication with the second surface of the device substrate.

In one embodiment, after removal of material at the second surface of the device substrate and prior to exposing at least a portion of the polymeric material disposed between the first surface and the carrier substrate to a substance through at least some of the first openings, the method may include depositing a dielectric passivation layer atop the second surface; and depositing a metal layer atop the dielectric passivation layer and in conductive communication with the conductive columns, wherein the metal layer comprises at least one of an adhesion layer or a barrier layer or a seed layer.

In one embodiment, the metal layer may be opaque.

In one embodiment, prior to exposing at least a portion of the polymeric material disposed between the first surface and the carrier substrate to a substance through at least some of the first openings, the method may include depositing and patterning a photoresist layer atop the metal layer such that the photoresist layer has openings overlying the conductive columns; forming a plurality of conductive elements within the openings of the photoresist layer; and removing the patterned photoresist layer and portions of the metal layer beyond the conductive elements.

In one embodiment, at least some of the conductive elements may be electrically coupled with at least some of the active circuit elements through the conductive columns.

In one embodiment, the polymeric material may include a photosensitive polymer. The photosensitive polymer may include one or more of polyimide, benzocyclobutene (BCB), epoxy based polymer, or polynorbornene based polymer.

In one embodiment, the photosensitive polymer may be a negative tone photosensitive polymer. The carrier substrate may protect the photosensitive polymer from exposure to ultraviolet light during removal of material from the second surface of the device substrate. The carrier substrate may include one or more of silicon (Si), a ceramic material, or a group III-V material.

In one embodiment, the photosensitive polymer may be a positive tone photosensitive polymer. The carrier substrate may be at least partially transparent to ultraviolet light. The carrier substrate may comprise one or more of silicon dioxide, sapphire, or alumina (Al2O3). An ultraviolet light-blocking layer may be deposited atop a surface of the carrier substrate opposite a photosensitive polymer facing surface of the carrier substrate either before or after bonding the first surface of the device substrate to the carrier substrate with a polymeric material. The ultraviolet light-blocking layer may be removed after removal of material at the second surface of the device substrate. Then, the photosensitive polymer may be exposed to ultraviolet light. Then, the photosensitive polymer may be exposed to a substance through at least some of the first openings.

In one embodiment, bonding the first surface of the device substrate to the carrier substrate may include assembling the first surface of the device substrate with the carrier substrate with at least some of the polymeric material therebetween. Then, a temperature of an environment in which the carrier substrate and device substrate are disposed may be elevated to about 200 degrees Celsius.

In one embodiment, bonding the first surface of the device substrate to the carrier substrate may include assembling the first surface of the device substrate with the carrier substrate with at least some of the polymeric material therebetween. Then, the polymeric material may be exposed to ultraviolet light.

In one embodiment, the polymeric material may have a thickness ranging from about 20 microns to about 100 microns between the first surface and a polymeric material facing side of the carrier substrate after bonding the carrier substrate to the device substrate.

In one embodiment, the polymeric material may have a modulus ranging from about 1 GPa to about 10 GPa after bonding the carrier substrate to the device substrate.

In one embodiment, the polymeric material may be a photosensitive polymer and the substance may be a developer. The photosensitive polymer may have a post-bonding lifetime for processing using the developer. At least a portion of the photosensitive polymer may be exposed to the developer through at least some of the first openings prior to expiration of the post-bonding lifetime to debond the device substrate from the carrier substrate. At least a portion of the photosensitive polymer may be exposed to an etchant to debond the device substrate from the carrier substrate after expiration of the post-bonding lifetime. The etchant may have a selectivity to the carrier substrate and device substrate ranging from about 2 to about 1000.

In one embodiment, the device substrate may have a thickness ranging from about 5 microns to about 300 microns after removal of material at the second surface of the device substrate.

In one embodiment, a method of processing a device substrate can include bonding a first surface of a device substrate to a carrier with a dielectric material. Then, material can be removed at the second surface of the device substrate, wherein at least some of the first openings communicate with the second surface at least one of before or after performing the removal of the material. Then, at least a portion of the dielectric material disposed between the first surface and the carrier substrate may be exposed to a substance through at least some first openings to debond the device substrate from the carrier substrate.

In one embodiment, the device substrate may have a plurality of first openings extending from the first surface towards a second surface of the device substrate opposite from the first surface. The device substrate may include a plurality of electrically conductive columns extending within a plurality of second openings extending in a direction of a thickness of the device substrate. The device substrate may include a plurality of microelectronic elements, each microelectronic element having a plurality of active circuit elements thereon, wherein the microelectronic elements are integral portions of the wafer and are bounded at edges of each semiconductor chip at dicing lanes of the wafer, and configured to be separated from one another by severing the wafer along the dicing lanes.

In one embodiment, the dielectric material may include an inorganic material.

In one embodiment, the first surface and a surface of the carrier substrate that opposes the first surface of the device substrate may include the dielectric material prior to bonding the first surface of the device substrate to the carrier substrate.

In one embodiment, one or more of a nitride, oxynitride, polyimide, polysilicon, copper, tungsten, or gold is present at the first surface underlying the dielectric material when bonding of the first surface of the device substrate to the carrier substrate is performed.

In one embodiment, the dielectric material may be a polymeric material. The polymeric material may be a photosensitive polymer. When a post-bonding lifetime of the photosensitive polymer is less than about 24 hours, at least a portion of the photosensitive polymer may be exposed to the substance through at least some of the first openings to debond the device substrate from the carrier substrate, wherein the substance may be a developer. When the post-bonding lifetime of the photosensitive polymer is greater than about 24 hours, at least a portion of the photosensitive polymer may be exposed to the substance through at least some of the first openings to debond the device substrate from the carrier substrate, wherein the substance may be an etchant.

In one embodiment, the photosensitive polymer may be a positive tone photosensitive polymer. The carrier substrate may be at least partially transparent to ultraviolet light. An ultraviolet light-blocking layer may be deposited atop a surface of the carrier substrate opposite a photosensitive polymer facing surface of the carrier substrate either before or after bonding the first surface of the device substrate to the carrier substrate. Then, the ultraviolet light-blocking layer may be removed after removal of material at the second surface of the device substrate. Then, the photosensitive polymer may be exposed to ultraviolet light. Then, at least a portion of the photosensitive polymer may be exposed to the substance through at least some of the first openings to debond the device substrate from the carrier substrate.

In one embodiment, the photosensitive polymer may be a negative tone photosensitive polymer and the carrier substrate may be opaque to ultraviolet light.

BRIEF DESCRIPTION OF THE DRAWINGS

FIG. 2A-1 depicts a side schematic view of a device substrate in accordance with some embodiments of the present invention.

DETAILED DESCRIPTION

Methods for processing a device substrate are disclosed herein. The inventive methods, in some cases, can use conventional or widely available products, such as polymers, which may or may not be photosensitive. In many cases, conventional equipment, such as deposition chambers, photoresist developer chambers, etch chambers or the like can be used in the inventive methods disclosed herein to bond and debond a device substrate from a carrier substrate. Other and further characteristics or advantages of the inventive methods are discussed herein.

Figure 1:
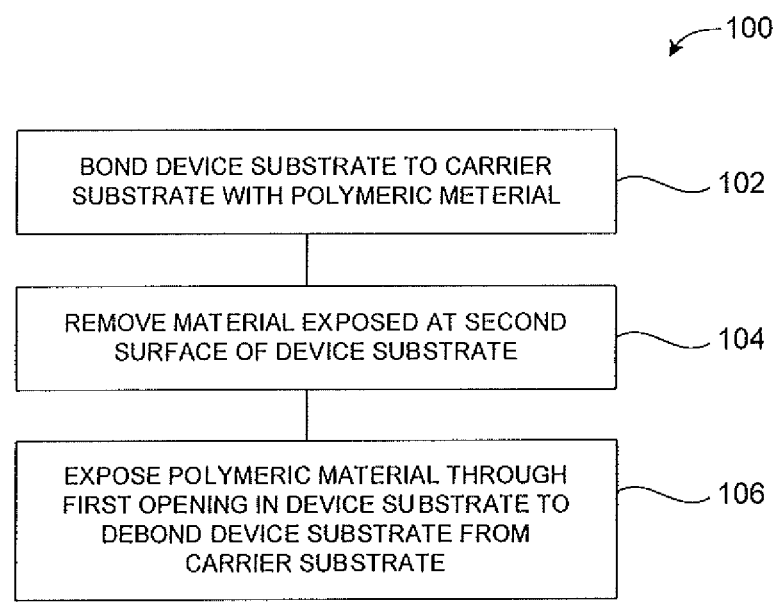
FIG. 1 depicts a flow chart of processing a device substrate in accordance with some embodiments of the present invention.
Figure 2A:
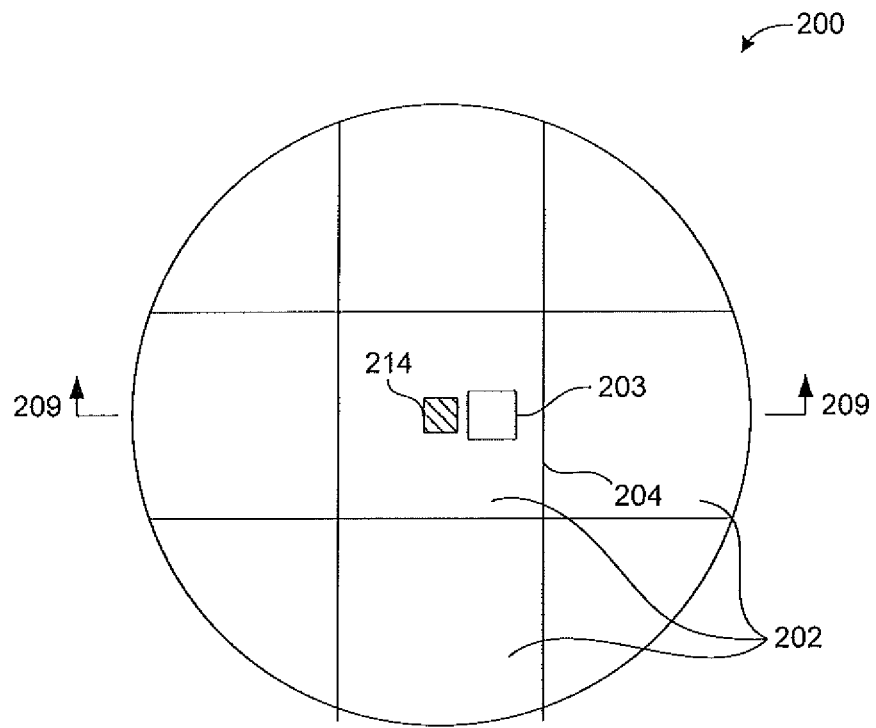
FIG. 2A depicts top down view of a device substrate in accordance with some embodiments of the present invention.
Figures 1, 2A:
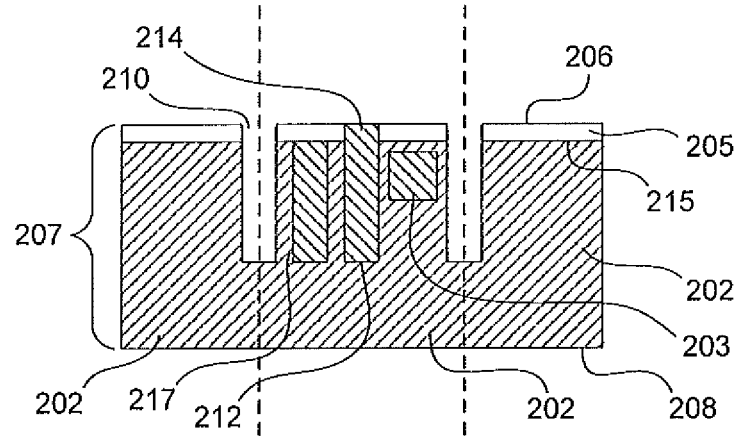

FIG. 1 depicts a flow chart 100 for processing a device substrate in accordance with some embodiments of the present invention. An exemplary device substrate 200 is illustrated in FIG. 2A in a top down view and a corresponding cross sectional view through line 209-209 is illustrated in FIG. 2A-1. For example, the device substrate 200 may be a semiconductor wafer, having a 200 mm, 300 mm, or other diameters. Although depicted as round, the device substrate may have any suitable shape. The device substrate 200 may include or consist essentially of one or more semiconductor materials, such as silicon (Si), silicon dioxide ($SiO_2$), Group III-V materials such as gallium arsenide (GaAs) and gallium nitride (GaN), Group IV materials such as silicon carbide (SiC) or silicon germanium (SiGe), and may have amorphous, monocrystalline, or polycrystalline or other structure.

The device substrate 200 may include a plurality of microelectronic elements 202, each of which may be or include a semiconductor chip, the microelectronic elements 202 being integral portions of a wafer, for example. Each microelectronic element 202 may have one or more active circuit elements 203 thereon. As seen in the cross sectional view in FIG. 2A-1, each active circuit element 203 typically has at least a portion extending within a semiconductor region of the device substrate 200 between the first surface 206 and an opposite second surface 208. In some embodiments, an active circuit element 203 may be one or more of a transistor, diode, or other suitable active circuit elements on the microelectronic element 202.

The device substrate 200 may include a plurality of first openings 210 extending from the first surface 206 of the device substrate 200 and towards the second surface 208. Each first opening 210 may have any suitable cross section, such as circular, rectangular as depicted in FIG. 2B, or other suitable cross sections.

The device substrate 200 may include a plurality of second openings 212 extending from the first surface 206 toward the second surface 208 of the device substrate 200. Alternatively, in one example, where the device substrate includes a dielectric layer 205 having the first surface 206 and disposed above a semiconductor region 207, second openings 217 may extend from a surface 215 of the semiconductor region 207 below the first surface 206 in a direction towards the second surface 208. The device substrate 200 may include a plurality of electrically conductive columns 214 extending within the plurality of second openings 212, 217. Although illustrated in FIG. 2A-1 as having a solid cross section, one or more conductive columns 214 may have a hollow structure such as a coating or be porous or made of composites of conductive and nonconductive components that may conform to the shape of the second openings 212. Each electrically conductive column 214 may comprise conductive paste, semiconductor material such as doped polysilicon or other material, or an electrically conductive material, such as a metal or conductive compound of a metal. For example, each electrically conductive column 214 may be a partially formed through silicon via (TSV) or through glass via (TGV). In one example, a TSV may be utilized in a set of fully completed microelectronic elements to form a stacked three dimensional device structure of vertically interconnected microelectronic elements. In some embodiments, as illustrated in FIG. 2A, each first opening 210 may extend deeper into the substrate 200 from the first surface 206 than each second opening 212. However, the depth of the second opening 212 can be greater than the first opening 210 in some embodiments, or the depths of the first and second openings 210, 212 can be the same.

Figure 2B:
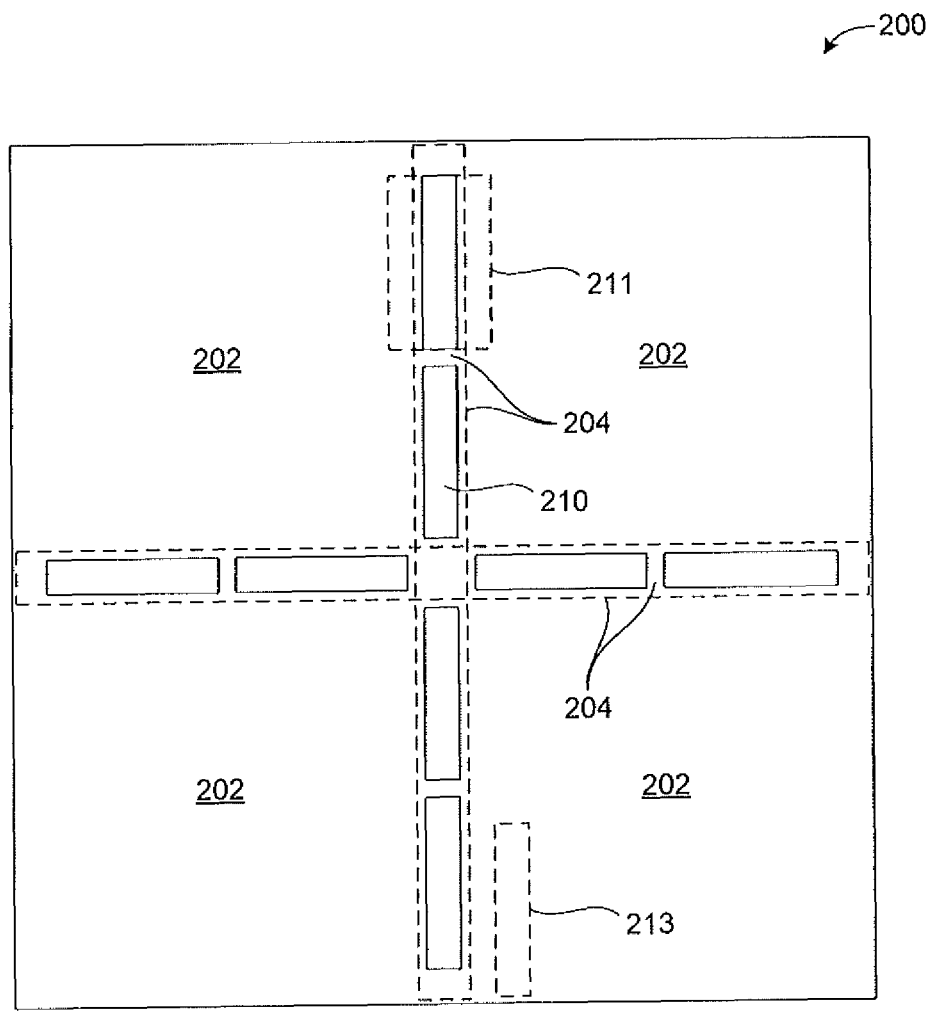
FIG. 2B depicts a portion of a device substrate in accordance with some embodiments of the present invention.

FIG. 2B depicts a portion of the device substrate 200 in accordance with some embodiments of the present invention. The device substrate 200 can be a semiconductor wafer and the microelectronic elements 202 can be semiconductor chips which are integral portions of the wafer bounded at the edges of each semiconductor chip by dicing lanes 204 of the wafer as shown in FIG. 2B. The dicing lanes 204 may have a finite width between adjacent microelectronic elements 202. For example, the microelectronic elements 202 may be configured to be separated from one another by severing the wafer along the dicing lanes 204. For example, the width of each dicing lane 204 may be proportional to a dicing tool such as a saw used to separate the microelectronic elements 202 from one another by cutting the wafer along the dicing lanes. In another example, a "scribe and break" technique can be used to sever the device substrate along the dicing lanes into individual microelectronic elements. In such case, the width of the dicing lane can be proportional to a width of a feature formed in a surface of the wafer during the scribing process which will determine the line along which the wafer will be cleaved into individual microelectronic elements.

As shown in FIG. 2B, in some embodiments, at least portions of at least some of the first openings 210 may be disposed within the dicing lanes 204. For example, the plurality of first openings 210 can be fully disposed within the dicing lanes 204. In some cases, some or all first openings 210 can be partially disposed within the dicing lanes 204 and also extend to areas of the microelectronic elements 202 outside the dicing lanes 204 (as illustrated by a first opening 211). Alternatively, or in combination with one or more of the above examples, one or more of the first opening 210 may be disposed completely outside the dicing lanes 204 (as illustrated by a first opening 213).

Figure 3A:
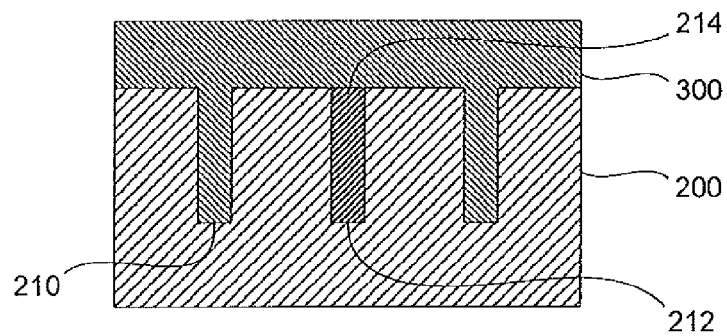
FIGS. 3A-3E depict the stages of processing using the flow chart of FIG. 1.

Returning to FIG. 1, at 102, the first surface 206 of the device substrate 200 may be bonded to a carrier substrate 302 with a polymeric material 300 therebetween. The flow chart 100 may be described in accordance with the stages of processing the device substrate 200 as illustrated in FIGS. 3A-F. For example, as illustrated in FIG. 3A, the polymeric material 300 can be assembled on the first surface 206 of the device substrate 200. The polymeric material may be applied in a liquid or air or gas-borne medium by one or more of spin coating, spray coating, or the like, or can be applied as a film of uncured or partially cured material, for example. In some embodiments, the plurality of first openings 210 can be at least partially filled with the polymeric material 300 when the polymeric material 300 is assembled on the first surface 206.

Exemplary polymers may include one or more of polyimide, benzocyclobutene (BCB), an epoxy based polymer, such as an SU-8 series resist from MicroChem. Corp., a polynorbornene based polymer, such as AVATREL®, available from Promerous LLC of Breksville, Ohio, or the like. The polymeric material may include additional materials, such as fillers, binders, or the like.

The carrier substrate 302 may comprise any suitable material which may be opaque to, or at least partially transparent to ultraviolet light, such as silicon (Si), a ceramic material, a group III-V material, silicon dioxide ($SiO_2$), a ceramic material, such as sapphire, or alumina ($Al_2O_3$).

The carrier substrate 302 may be bonded to the device substrate 200 by one or more processes. For example, in some embodiments, the first surface 206 of the device substrate and the carrier substrate 302 may be assembled with at least some of the polymeric material 300 therebetween. Then, a temperature of an environment in which the carrier substrate 302 and the device substrate 200 are disposed may be heated to about 200 degrees Celsius. In some embodiments, the temperature may range from about 80 degrees Celsius to about 200 degrees Celsius. Alternatively or in combination, the polymeric material 300 may be exposed to ultraviolet light to bond the carrier substrate 302 to the device substrate 200.

After bonding, the polymeric material 300 may have a thickness ranging from about 20 microns to about 100 microns. In some embodiments, the polymeric material 300 may have a modulus ranging from about 1 GPa to about 10 GPa after bonding.

Figure 3B:
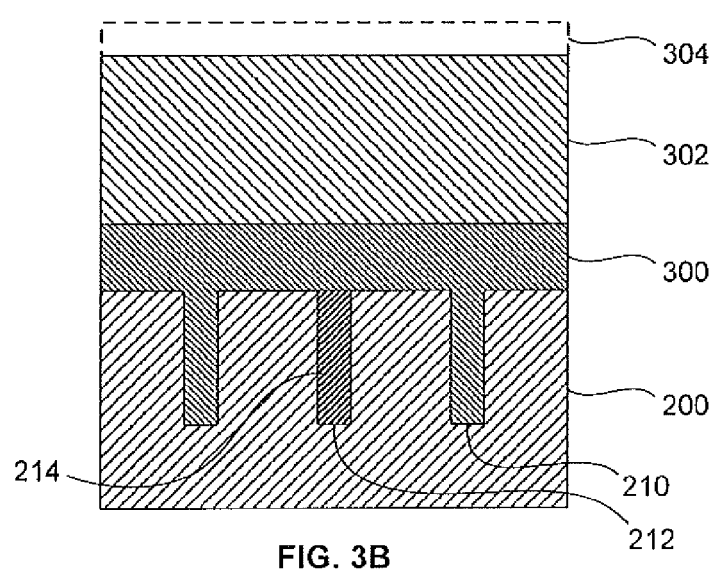
Figure 3C:
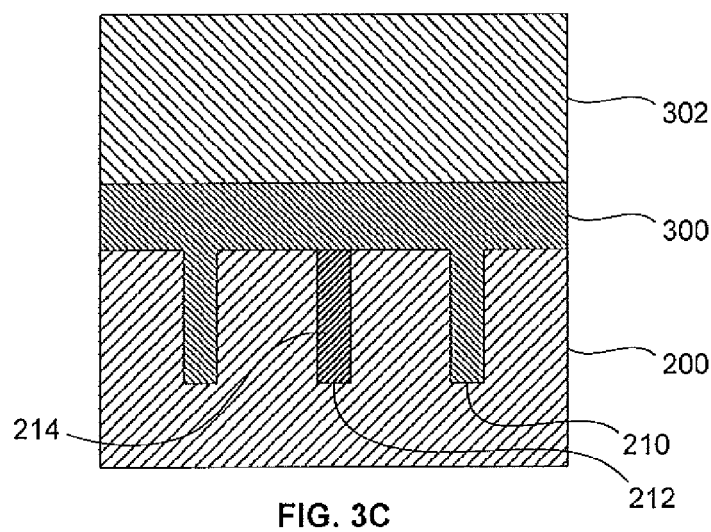

At 104, material may be removed at the second surface 208 of the device substrate 200 as illustrated in FIG. 3C. Step 104 can include reducing the thickness of the device substrate 200. The method by which the thickness of the device substrate 200 is reduced and further processing steps may be as described by a flow chart 400 depicted in FIG. 4 and accompanying stages of processing depicted in FIGS. 5A-F further below. In one example, after reducing the thickness of the device substrate 200, electrically conductive contacts 508 may be formed which are exposed at the second surface 208 of the device substrate 200. Typically, at least some of the contacts 508 are electrically connected with one or more of the active circuit elements 203 through the conductive columns 214, and other wiring (not shown) near the first surface of the device substrate 200, or conductive pads (not shown) or other contacts exposed at first surface 206 of the device substrate 200.

Figure 3D:
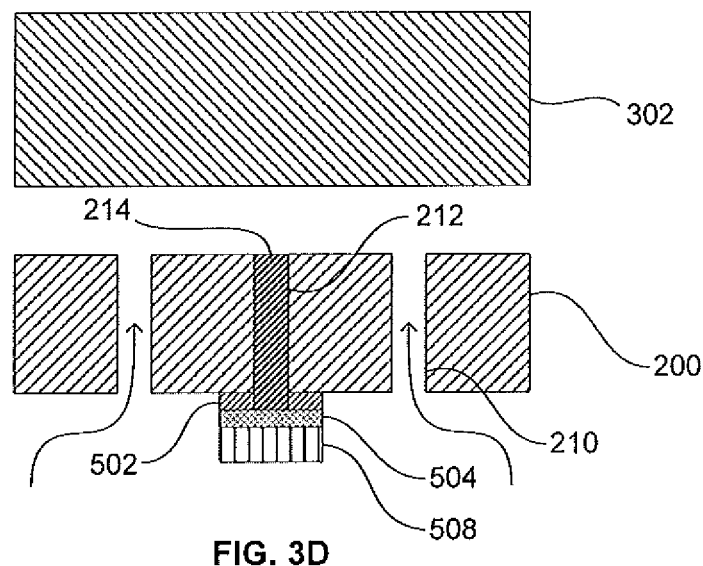
Figure 3E:
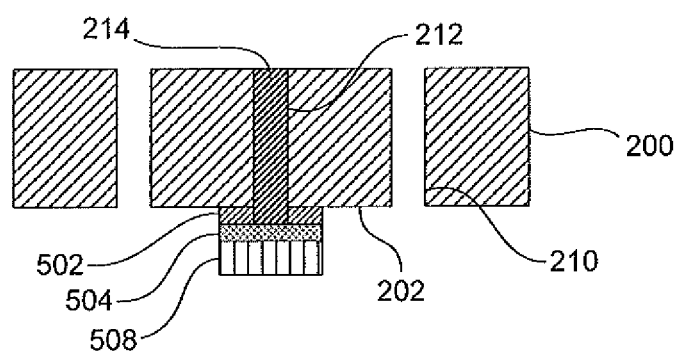

At 106, and illustrated in FIGS. 3D-E, once the second surface 206 of the device substrate has been processed, for example using a method described by the flow chart 400 or another suitable processing method as discussed further below, the at least a portion of the polymeric material 300 may be exposed to a substance through at least some of the first openings 210 to cause the device substrate 200 to become debonded from the carrier substrate 302.

For example, the debonding of the device substrate 200 from the carrier substrate 302 may be performed in various ways. For example, in some embodiments, an etchant may be applied through first openings 210 to attack the polymeric material 300 thereby freeing the device substrate 200 from the carrier substrate 302. For example, suitable etchants may include Kapton® Polyimide etchant, available from Transene Inc. of Danvers, Mass., Dynasolve 165, available from Dynaloy, LLC. of Indianapolis, Ind., T1100, available from the Dow Chemical Co. of Midland, Mich., or the like.

In some embodiments, the polymeric material 300 can includes a photosensitive polymer. In such example, a developer can be introduced through the first openings 210, which in turn, may dissolve the photosensitive polymer and thereby free the device substrate 200 from the carrier substrate 302.

For example, the photosensitive polymer can be a negative tone photosensitive polymer. In such case, the carrier substrate 302 may be opaque to limit or prevent exposure of the negative tone photosensitive polymer to ultraviolet light. Once processing has been completed using the method described by the flow chart 400 or another suitable method, the negative tone photosensitive polymer may be exposed to the developer to dissolve the polymeric material.

In another example, the photosensitive polymer can be a positive tone photosensitive polymer. In such case, the carrier substrate may be at least partially transparent to ultraviolet light and have an ultraviolet light blocking layer 304 disposed thereon as illustrated in FIG. 3B. The ultraviolet light blocking layer 304 may be assembled atop a surface of the carrier substrate 302 opposing the polymeric material facing surface of the carrier substrate 302 either before or after bonding the carrier substrate to the device substrate at 104. Once processing has been complete by the method described by the flow chart 400 or another suitable method, the ultraviolet light blocking layer 304 may be removed so that the positive tone photosensitive polymer can be exposed to ultraviolet light. After exposure to ultraviolet light, the positive tone photosensitive polymer can be dissolved by a developer.

In some embodiments, the photosensitive polymer may have a post-bonding lifetime for processing the polymer using the developer. Accordingly, if the post-bonding lifetime has not been exceeded, then the photosensitive polymer may be removed using the developer. However, if the post-bonding lifetime has been exceeded, then the photosensitive polymer may be removed using an etchant. In some embodiments, an etchant may be selected over a developer when the post-bonding lifetime exceeds about 24 hours. The etchant may have a selectivity to the carrier substrate 302 and the device substrate 200 ranging from about 2 to about 1000.

In some embodiments, a dielectric material may be used to bond the device substrate 200 to the carrier substrate 302. For example, this dielectric material may include an inorganic material, such as silicon oxide, spin-on glass (SOG), or the like.

The first surface 206 and a surface of the carrier substrate 302 opposing the first surface 206 may include the dielectric material prior to bonding the device substrate 200 to the carrier substrate 300 at 102. In some cases, the carrier substrate 302 may be formed of the dielectric material and the first surface 206 of the device substrate 200 may include the dielectric material. In some cases, the dielectric material may be deposited on the surface of the carrier substrate 302 and on the device substrate 200 prior to bonding at 102. For example, the dielectric material may be deposited by spin coating or other suitable deposition techniques.

Prior and/or post deposition of the dielectric material and prior to bonding at 102, the surfaces of the carrier substrate 302 and the device substrate 200 may be cleaned and/or smoothed. In some cases, the surfaces may be cleaned with one or more of ammonia ($NH_4OH$), hydrogen peroxide (H2O2), and sulphuric acid ($H_2SO_4$). In some cases, a cleaning solution may include $NH_4OH$ and $H_2O_2$. In some cases, a cleaning solution may include $H_2SO_4$ and $H_2O_2$. In some cases, the surfaces may be smoothed by polishing, grinding, lapping, or the like. In some cases, the cleaning and/or smoothing processes may activate the surfaces for bonding of the dielectric material.

Bonding of the device substrate 200 to the carrier substrate 302 using the dielectric material may be performed by controlling the temperature of the environment in which the dielectric material is disposed during the bonding process up to temperatures of about 500 degrees Celsius. In some cases, the temperature of the environment may range from about room temperature to about 500 degrees Celsius. In some cases, opposing forces may be applied to the carrier substrate 302 and the device substrate 200, respectively, while the dielectric material is at bonding temperatures to form a bond between the opposing surfaces of the carrier substrate 302 and the device substrate 200 using the dielectric material. In some cases, after a bond has been formed, an optional anneal of the bond may be performed to remove voids and/or other defects in the bond. For example, the anneal may be used to improve mechanical properties of the bond for subsequent processing of the device substrate 200.

In some cases, one or more of a nitride, oxynitride, polyimide, polysilicon, copper, tungsten, or gold at the first surface 206 can be present at, e.g., provided at the first surface underlying the dielectric material when the device substrate is bonded to the carrier substrate via the dielectric material. Any one or more of these materials may be used as an etch stop to protect components of the device substrate 200, such as inter layer dielectric materials, e.g., low-k dielectric materials, and the like from exposure to a substance which may be used to debond the device substrate 200 from the carrier substrate 302 after processing at 106. In some cases, the substance can be an etchant, such as aqueous or vapor phase hydrofluoric acid (HF), buffered oxide etch (BOE), or the like.

Figure 4:
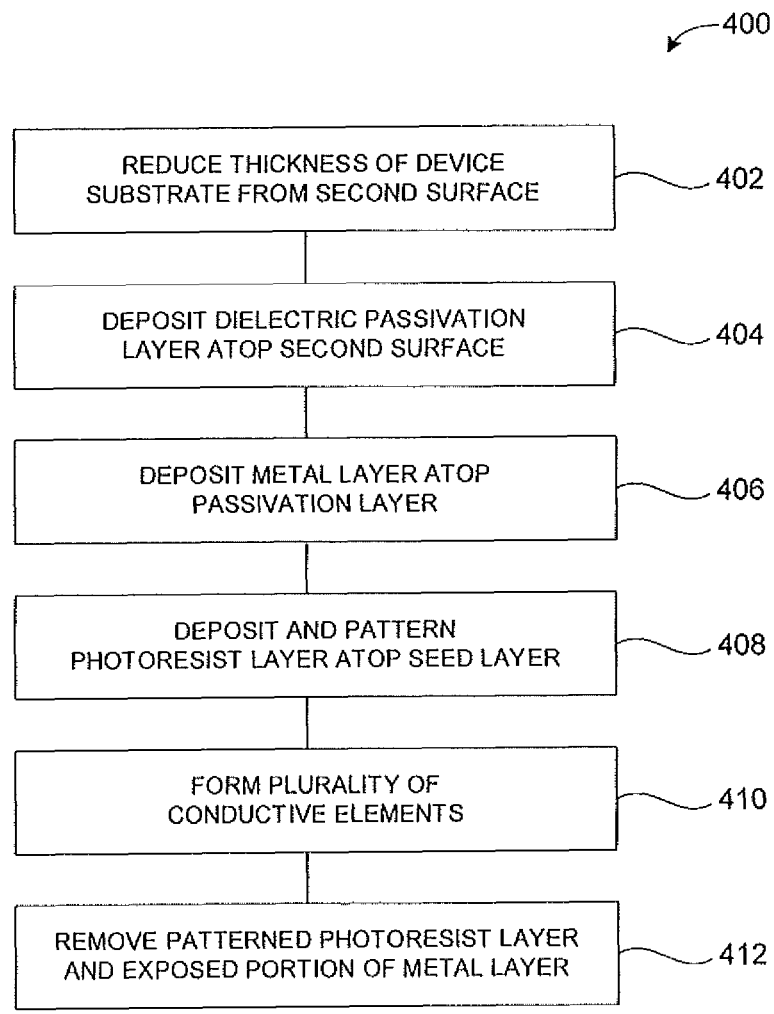
FIG. 4 depicts a flow chart of processing a device substrate in accordance with some embodiments of the present invention.

FIG. 4 depicts a flow chart 400 of processing the device substrate 200 in accordance with some embodiments of the present invention. The flow chart 400 is described herein in accordance with the stage of processing the device substrate 200 as depicted in FIGS. 5A-F.

At 402, where the thickness of the device substrate 200 may be reduced from the second surface 208. For example, after removal of material from the second surface 208, at least some of the first openings 210 may communicate with the second surface 208. Alternatively, or in combination, at least some of the first openings 210 may communicate with the second surface 208 prior to step 104, i.e., even before material is removed from the device substrate 200.

Similarly, the removal process at step 402 may cause at least some of the electrically conductive columns 214 communicate with the second surface 208 of the device substrate 200.

The thickness of the device substrate 200 may be reduced by applying one or more of polishing, grinding, lapping or etching. For example, in some embodiments, the thickness may be reduced using polishing, grinding, or lapping. For example, polishing, grinding, or lapping may be used when the device substrate comprises tungsten (W) or silicon (Si), such as polysilicon or the like.

Figure 5A:
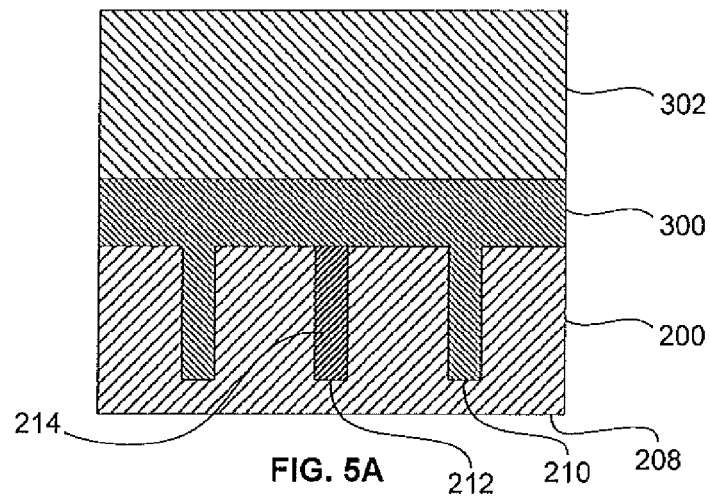
FIGS. 5A-5F depict the stages of processing a device substrate using the flow chart of FIG. 4.
Figure 5B:
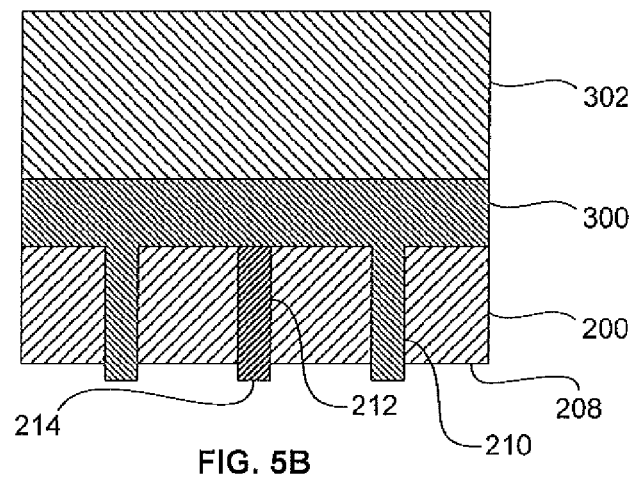

Alternatively, a combination of polishing, lapping, or grinding, and etching may be used. For example, in some embodiments, the thickness may be reduced from the second surface 208 until each first and second opening is within a predetermined distance from the second surface 208. Then, the device substrate 200 may be etched from the second surface 208 to cause the at least some of the first and second openings 210, 212 to be in communication with the second surface 208. A mechanical process such as polishing, grinding, or lapping may be used to thin the substrate. An etch process may also be applied in some cases to cause the electrically conductive columns 214 to be revealed after the mechanical process, particularly when the columns 214 comprise copper (Cu). For example, as illustrated in FIG. 5B, when etching is used, the etchant may have greater selectivity for the second surface 208 than either the electrically conductive columns 214 or the polymeric material 300 which may be extending towards the second surface 208 through the first openings 210. Accordingly, as illustrated in FIG. 5B, the electrically conductive columns 214 and the polymeric material 300 may protrude from the second surface 206 after etching.

Figure 5C:
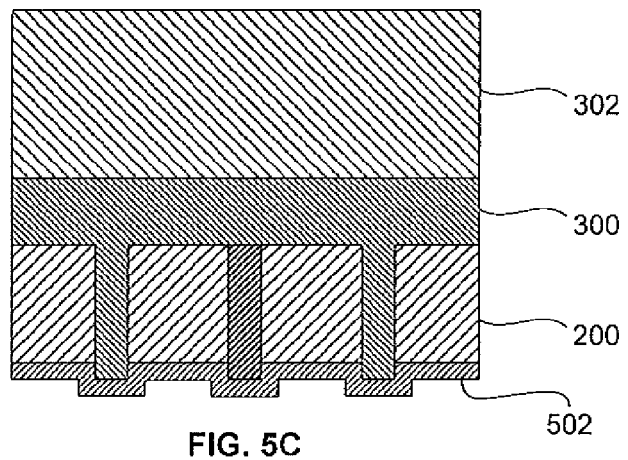

At 406, a dielectric passivation layer 502 may be deposited atop the second surface 208 including atop the electrically conductive columns 214 and/or polymeric material 300 which may be extending from the first and second openings 210, 212 beyond the second surface 208 as illustrated in FIG. 5C. For example, the dielectric passivation layer 502 may be utilized, among other reasons, to prevent exposure of the polymeric material 300 to ultraviolet light during subsequent process steps, when such material 300 is sensitive to ultraviolet light, as discussed above.

The dielectric passivation layer 502 may be an organic or inorganic layer, and may be deposited by any suitable deposition method such as chemical vapor deposition (CVD), physical vapor deposition (PVD), spin coating, spray coating, or the like. Exemplary materials for the dielectric passivation layer 502 may include one or more of polyimide, oxides, nitrides, or the like. In some embodiments, polishing, grinding or etching or other techniques may be utilized to selectively remove the passivation layer from the conductive columns 214.

Figure 5D:
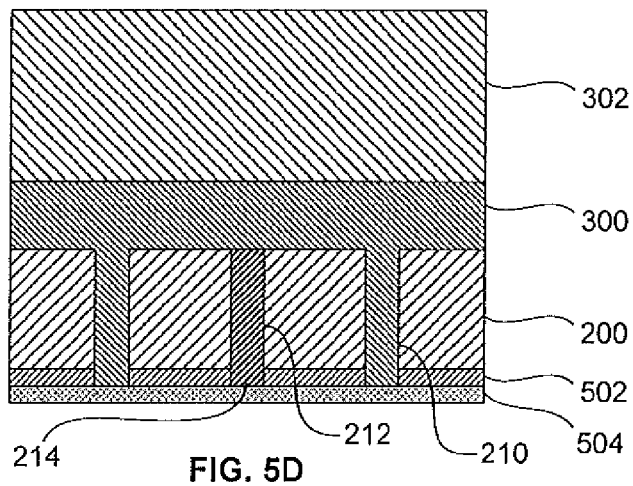

At 406, a metal layer 504 may be deposited atop the dielectric passivation layer and in conductive communication with the conductive columns 214 as illustrated in FIG. 5D. For example, the metal layer 504 may comprise at least one of an adhesion or barrier or seed layer. Exemplary materials for the metal adhesion layer may include titanium (Ti), chromium (Cr), or the like. Exemplary materials for barrier layer may include one or more of tantalum nitride (TaN), titanium nitride (TiN), titanium tungsten (TiW), silicon nitride (SiN), nickel (Ni), or the like. Exemplary materials for the metal seed layer may include one or more of copper (Cu), gold (Au), or the like. In some embodiments, the metal layer may be opaque, for example, such as to limit exposure of the polymeric material 300, whether extending through the first openings 210 and/or exposable through the first openings, to ultraviolet light during processing.

Figure 5E:
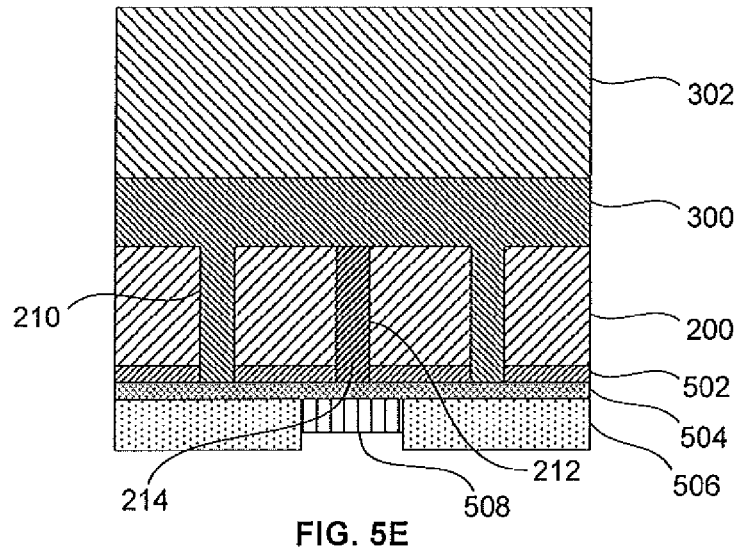

At 408, a photoresist 506 may be deposited and patterned atop the metal layer 504 as illustrated in FIG. 5E. The patterned photoresist 506 may be such that the photoresist layer has openings overlying the conductive columns 214.

At 410, a conductive element 508 is formed within each opening in the patterned photoresist 506. Each conductive element 508 may be electrically connected to the active circuit elements 203 of the microelectronic elements 202 by the conductive columns 214, and/or one or more of conductive elements 508 may be used to electrically couple power through the conducive columns 214 to an adjacent microelectronic element which can be stacked above the microelectronic element 202.

Figure 5F:
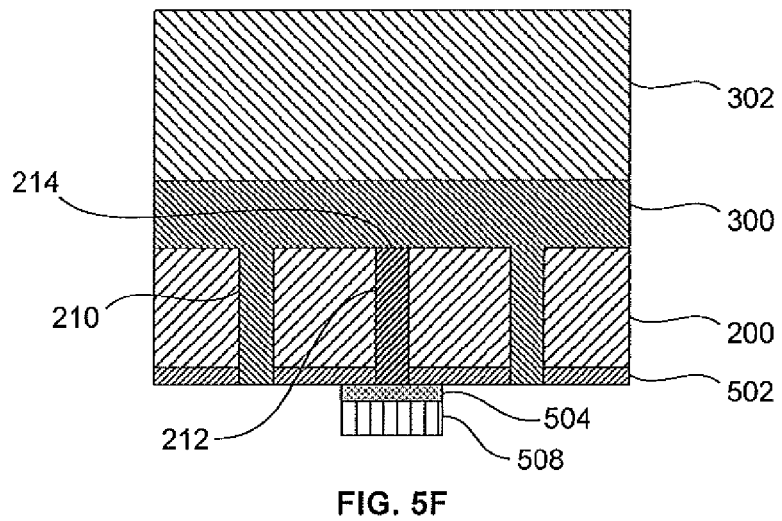

At 412, the patterned photoresist 506 and portions of the metal layer 504 beyond the conductive elements 508 are removed by a stripping process as illustrated in FIG. 5F. In some embodiments, at least a portion of the dielectric passivation layer 502 remains above the opposing ends of the first openings 210 to limit or prevent exposure of the polymeric material 300.

FIG. 6 depicts one suitable apparatus and the stages of separating the device substrate 200 from the carrier substrate 302 in accordance with some embodiments of the present invention. For example, as illustrate in top down and side schematic views in FIG. 6A, an apparatus 600 may include a container 602 for holding the substance, such as an etchant or developer. The container 602 may further include additional devices or openings for circulating the substance about the container 602.

As illustrated, the diameter of the carrier substrate 302 may exceed the diameter of the device substrate 200. Accordingly, a first set of clamps 604 may be utilized to hold the carrier substrate 302 about the peripheral edge thereof. For example, as illustrated, there are three clamps 604 disposed at about 120 degrees apart about the circumference of the carrier substrate 302. However, this number of clamps 604 and/or orientation is merely exemplary and any suitable number and/or configuration of the clamps 604 may be used.

Figure 6A:
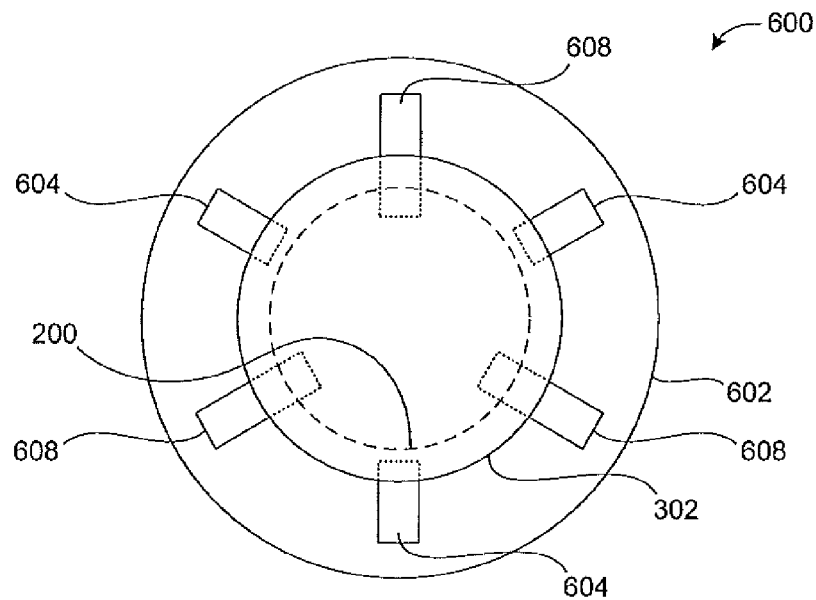
FIGS. 6A-D depict the stages of debonding a device substrate from a carrier substrate in accordance with some embodiments of the present invention.
Figure 6A:
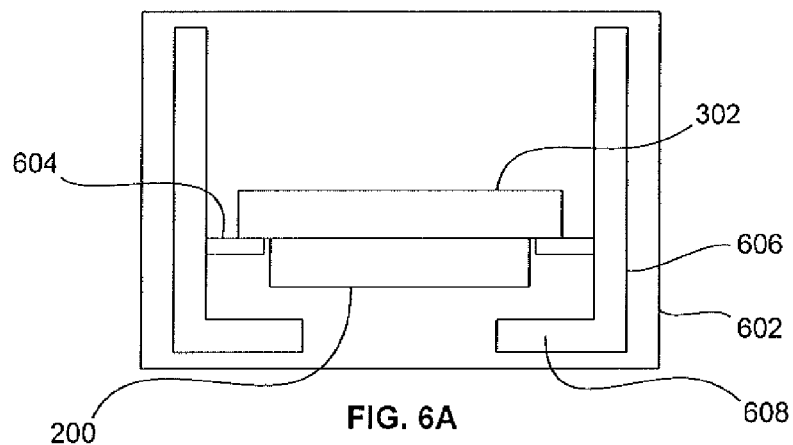
Figure 6B:
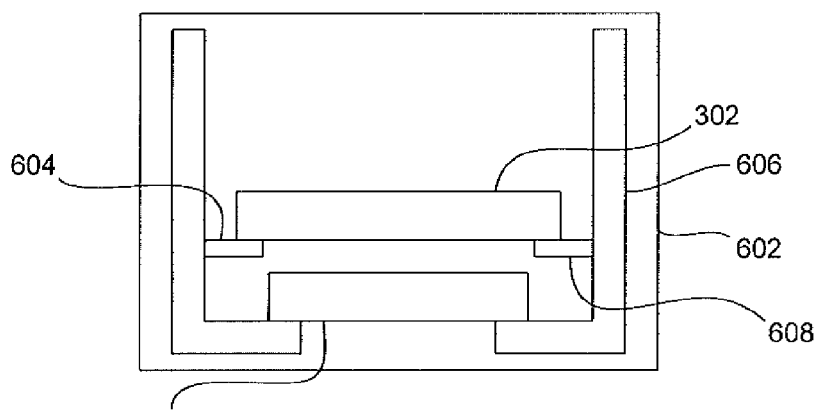

An opposing set of clamps 606 is disposed about the carrier substrate 302 as illustrated in FIGS. 6A-B. The opposing clamps 606 have ends 608 that are initially disposed below the device substrate 200 and are positioned to receive the device substrate 200 when it is debonded from the carrier substrate 302 as illustrated in FIG. 6B. Once received by the clamps 606 after debonding, the apparatus may be removed from the container 602.

The processed device substrate 200 may have a thickness ranging from about 5 microns to about 300 microns. Accordingly, for device substrates having such a thickness range, the device substrate may experience some deflection due to gravity when supported about the peripheral edges thereof, such as by the clamps 606. If excessive, such deflection could fracture the device substrate. The presence of other features, such as the first openings 210 as discussed above, could potentially increase the deflection due to gravity.

The inventor has studied the deflection due to gravity using finite element methods. For example, solving the Kirchoff-Love deflection formula for a substrate that is a cylindrical plate having clamped edges, the maximum deflection was determined to be about 204 microns on a 100 micron thick, 200 mm diameter silicon wafer, assuming a Young's Modulus of 180 GPA and a Poisson ratio of 0.17. Similarly, when repeating the simulation, except further assuming that the substrate is divided into 20 mm×20 mm microelectronic elements, wherein 100 micron wide, 10 mm long first openings extend beyond the width of the dicing lane (such as first opening 211 illustrated in FIG. 2B), the maximum deflection due to gravity increased to about 229 microns. Accordingly, in both simulations, i.e., with or without first openings, the maximum deflection is below about 1% strain, such that the processed 100 micron thick wafer with the aforementioned first openings deflects to an extent that is well within a recognized 1% strain from handling the thinned wafer as a bare wafer using support at the edges alone.

Figure 6C:
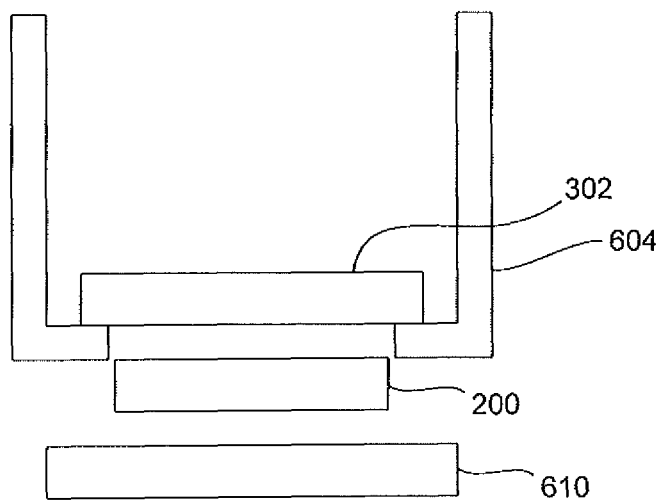
Figure 6D:
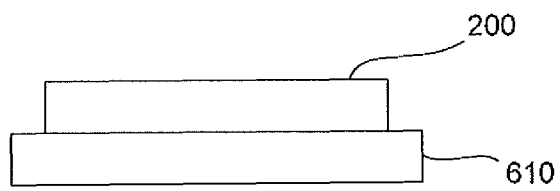

Returning to FIG. 6, the clamps 606, acting independently of the clamps 604 which still support the carrier substrate 302, may release the debonded device substrate 200 onto dicing tape 610 or another suitable surface as illustrated in FIG. 6C. Once coupled to the dicing tape 610, the device substrate 200 may be taken to a dicing tool to separate the microelectronic elements 202, or for further processing.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of processing a device substrate, comprising:
    a) bonding a first surface of a device substrate to a carrier with a polymeric material, wherein the device substrate has a plurality of first openings extending from the first surface towards a second surface of the device substrate opposite from the first surface;
    b) then removing material exposed at the second surface of the device substrate by at least one of grinding, lapping, or polishing to reduce a thickness of the device substrate and to cause at least some of the first openings to communicate with the second surface; and
    c) then exposing at least a portion of the polymeric material disposed between the first surface and the carrier substrate to a substance through at least some first openings to debond the device substrate from the carrier substrate.

2. The method of claim 1, wherein when step (a) is performed, the polymeric material is disposed atop the first surface and extends from the first surface into at least some of the first openings.

3. The method of claim 1, wherein the device substrate includes a plurality of microelectronic elements, each microelectronic element having a plurality of active circuit elements thereon.

4. The method of claim 3, wherein the device substrate is a semiconductor wafer and the microelectronic elements are semiconductor chips which are integral portions of the wafer and are bounded at edges of each semiconductor chip at dicing lanes of the wafer, and
    wherein the microelectronic elements are configured to be separated from one another by severing the wafer along the dicing lanes.

5. The method of claim 4, further comprising:
    (d) then separating the microelectronic elements from one another by severing the debonded device substrate along the dicing lanes.

6. The method of claim 4, wherein at least portions of at least some of the first openings are disposed within the dicing lanes.

7. The method of claim 6, wherein each of the plurality of first openings is fully disposed within the dicing lanes.

8. The method of claim 6, wherein the at least some of the first openings extend to areas of the semiconductor chips outside the dicing lanes.

9. The method of claim 4, wherein at least some of the first openings are completely disposed outside of the dicing lanes.

10. The method of claim 3, wherein when step (a) is performed, the device substrate includes a plurality of electrically conductive columns extending within a plurality of second openings extending in a direction of a thickness of the device substrate.

11. The method of claim 10, wherein step (b) is performed so as to cause at least some of the conductive columns to become exposed at the second surface of the device substrate.

12. The method of claim 11, wherein the reducing the thickness of the device substrate is performed such that at least some of the first and second openings are within a predetermined distance from the second surface; and
    then etching the device substrate from the second surface to cause the at least some first openings to be in communication with the second surface of the device substrate.

13. The method of claim 11, further comprising, after performing step (b) and prior to performing step (c),
    depositing a dielectric passivation layer atop the second surface; and
    depositing a metal layer atop the dielectric passivation layer and in conductive communication with the conductive columns, wherein the metal layer comprises at least one of an adhesion layer or a barrier layer or a seed layer.

14. The method of claim 13, wherein the metal layer is opaque.

15. The method of claim 13, further comprising prior to performing step (c)
depositing and patterning a photoresist layer atop the metal layer such that the photoresist layer has openings overlying the conductive columns;
forming a plurality of conductive elements within the openings of the photoresist layer; and
removing the patterned photoresist layer and portions of the metal layer beyond the conductive elements.

16. The method of claim 15, wherein at least some of the conductive elements are electrically coupled with at least some of the active circuit elements through the conductive columns.

17. The method of claim 1, wherein the polymeric material includes a photosensitive polymer.

18. The method of claim 17, wherein the photosensitive polymer comprises one or more of polyimide, benzocyclobutene (BCB), epoxy based polymer, or polynorbornene based polymer.

19. The method of claim 17, wherein the photosensitive polymer is a negative tone photosensitive polymer.

20. The method of claim 19, wherein the carrier substrate protects the photosensitive polymer from exposure to ultraviolet light during step (b).

21. The method of claim 20, wherein the carrier substrate comprises one or more of silicon (Si), a ceramic material, or a group III-V material.

22. The method of claim 17, wherein the photosensitive polymer is a positive tone photosensitive polymer.

23. The method of claim 22, wherein the carrier substrate is at least partially transparent to ultraviolet light.

24. The method of claim 23, wherein the carrier substrate comprises one or more of silicon dioxide, sapphire, or alumina ($Al_2O_3$).

25. The method of claim 23, further comprising:
depositing an ultraviolet light-blocking layer atop a surface of the carrier substrate opposite a polymeric material facing surface of the carrier substrate either before or after step (a).

26. The method of claim 25, further comprising:
removing the ultraviolet light-blocking layer after step (b),
wherein step (c) includes exposing the photosensitive polymer to ultraviolet light, and then exposing the photosensitive polymer to the substance through at least some of the first openings to debond the device substrate from the carrier substrate.

27. The method of claim 1, wherein step (a) includes
assembling the first surface of the device substrate with the carrier substrate with at least some of the polymeric material therebetween and then elevating a temperature of an environment in which the carrier substrate and device substrate are disposed to about 200 degrees Celsius.

28. The method of claim 1, wherein step (a)
assembling the first surface of the device substrate with the carrier substrate with at least some of the polymeric material therebetween, and then exposing the polymeric material to ultraviolet light.

29. The method of claim 1, wherein the polymeric material has a thickness ranging from about 20 microns to about 100 microns between the first surface and a polymeric material facing side of the carrier substrate after step (a).

30. The method of claim 1, wherein the polymeric material has a modulus ranging from about 1 GPa to about 10 GPa after step(a).

31. The method of claim 1, wherein the polymeric material is a photosensitive polymer and the substance is a developer.

32. The method of claim 31, wherein the photosensitive polymer has a post-bonding lifetime for processing using the developer, and wherein step (c) further comprises:
exposing at least some of the photosensitive polymer to the developer through at least some of the first openings prior to expiration of the post-bonding lifetime to debond the device substrate from the carrier substrate.

33. The method of claim 31, wherein the photosensitive polymer has a post-bonding lifetime for processing using the developer, and wherein step (c) further comprises:
exposing at least some of the photosensitive polymer to an etchant through at least some of the first openings to debond the device substrate from the carrier substrate.

34. The method of claim 33, wherein step (c) is performed after expiration of the post-bonding lifetime.

35. The method of claim 33, wherein the etchant has a selectivity to the carrier substrate and device substrate ranging from about 2 to about 1000.

36. The method of claim 1, wherein the device substrate has a thickness ranging from about 5 microns to about 300 microns after step (b).

37. A method of processing a device substrate, comprising:
a) bonding a first surface of a device substrate to a carrier with a dielectric material, wherein the device substrate has a plurality of first openings extending from the first surface towards a second surface of the device substrate opposite from the first surface,
b) removing material exposed at the second surface of the device substrate by at least one of grinding, lapping, or polishing to reduce a thickness of the device substrate and to cause at least some of the first openings to communicate with the second surface; and
c) then exposing at least a portion of the dielectric material disposed between the first surface and the carrier substrate to a substance through at least some first openings to debond the device substrate from the carrier substrate.

38. The method of claim 37, wherein the device substrate includes a plurality of electrically conductive columns extending within a plurality of second openings extending in a direction of a thickness of the device substrate,
wherein the device substrate includes a plurality of microelectronic elements, each microelectronic element having a plurality of active circuit elements thereon, and
wherein the microelectronic elements are integral portions of the wafer and are bounded at edges of each semiconductor chip at dicing lanes of the wafer, and configured to be separated from one another by severing the wafer along the dicing lanes.

39. The method of claim 38, wherein the dielectric material includes an inorganic material.

40. The method of claim 39, wherein the first surface and a surface of the carrier substrate that opposes the first surface of the device substrate include the dielectric material prior to step (a).

41. The method of claim 40, wherein one or more of a nitride, oxynitride, polyimide, polysilicon, copper, tungsten, or gold is present at the first surface underlying the dielectric material when step (a) is performed.

42. The method of claim 38, wherein the dielectric material is a polymeric material.

43. The method of claim 42, wherein the polymeric material is a photosensitive polymer.

44. The method of claim 43, wherein a post-bonding lifetime of the photosensitive polymer is less than about 24 hours, and wherein step (c) further comprises:

exposing at least a portion of the photosensitive polymer to the substance through at least some of the first openings to debond the device substrate from the carrier substrate, wherein the substance is a developer.

45. The method of claim 43, wherein a post-bonding lifetime of the photosensitive polymer is greater than about 24 hours, and wherein step (c) further comprises:

exposing at least a portion of the photosensitive polymer to the substance through at least some of the first openings to debond the device substrate from the carrier substrate, wherein the substance is an etchant.

46. The method of claim 43, wherein the photosensitive polymer is a positive tone photosensitive polymer and wherein the carrier substrate is at least partially transparent to ultraviolet light, and further comprising:

depositing an ultraviolet light-blocking layer atop a surface of the carrier substrate opposite a photosensitive polymer facing surface of the carrier substrate either before or after step (a); and removing the ultraviolet light-blocking layer after step (b), wherein step (c) includes exposing the photosensitive polymer to ultraviolet light, and then exposing at least a portion of the photosensitive polymer to the substance through at least some of the first openings to debond the device substrate from the carrier substrate.

47. The method of claim 43, wherein the photosensitive polymer is a negative tone photosensitive polymer and wherein the carrier substrate is opaque to ultraviolet light.

* * * * *